United States Patent [19]

Montoye

[11] Patent Number: 5,130,575

[45] Date of Patent: Jul. 14, 1992

[54] TESTABLE LATCH SELF CHECKER

[75] Inventor: Robert K. Montoye, Austin, Tex.

[73] Assignee: International Business Machines Corporation, Armonk, N.Y.

[21] Appl. No.: 675,747

[22] Filed: Mar. 27, 1991

Related U.S. Application Data

[62] Division of Ser. No. 410,555, Sep. 20, 1989.

[51] Int. Cl.$^5$ .............................................. H03K 19/21
[52] U.S. Cl. .................................... 307/471; 364/787; 307/451
[58] Field of Search .......................... 307/451, 471; 364/784–788, 768

[56] References Cited

U.S. PATENT DOCUMENTS

| | | | |
|---|---|---|---|
| 4,493,077 | 1/1985 | Agrawal | 371/25 |
| 4,513,418 | 4/1985 | Bardell | 371/25 |
| 4,554,664 | 11/1975 | Schultz | 371/25 |
| 4,730,266 | 3/1988 | van Meerbergen et al. | 364/787 |
| 4,761,760 | 8/1988 | Tomoji | 364/788 |
| 4,968,903 | 11/1990 | Smith et al. | 307/451 |
| 4,982,117 | 1/1991 | Matsuzaki et al. | 307/451 |

FOREIGN PATENT DOCUMENTS 3811151 12/1988 Fed. Rep. of Germany ...... 307/471

OTHER PUBLICATIONS

A CMOS LSSD test generation system, D. Leet et al., IBM J. Res. Develop. Sep. 1984, pp. 625-635.

*Primary Examiner*—David Hudspeth
*Assistant Examiner*—Andrew Sanders
*Attorney, Agent, or Firm*—Ratner & Prestia

[57] ABSTRACT

The present invention operates by verifying correct latch operation in a digital circuit. After a value has been stored in a latch, electronic circuitry can verify that the value has been stored correctly. The electronic circuitry that performs this verification can be tested to insure that it is operating properly. Several latches can be wired into a scan chain and tested with relative ease. Operation of the present invention is illustrated by an enhanced master-slave latch system. In this system, two comparators are used. A first comparator is used to determine if the internal state of the master latch is identical to the signal which has been applied to this latch's data input terminal. A second comparator is used to determine if the state transfer between the master and slave latches occurs properly. Each comparator consists of an EXCLUSIVE-OR function. By placing known logic levels on each input terminal of the comparison circuitry, the output terminal of the comparison circuitry can be examined for an expected logic level to verify that it is operating properly. By placing several latches into a scan chain, a single latch can be loaded with data which will cause an expected signal to appear on the output terminal of this latch's comparison circuitry. This allows for simplified testing of a multiple latch system.

4 Claims, 8 Drawing Sheets

TESTABLE LATCH SELF CHECKER

This application is a division, of application Ser. No. 410,555, filed Sep. 20, 1989.

FIELD OF THE INVENTION

This invention is in the field of logic circuitry and specifically is directed to the detection of errors in electronic logic components. In particular, a self checking latch system is disclosed.

BACKGROUND OF THE INVENTION

A latch is a basic component of digital circuitry within many digital designs. While latches typically operate with a high rate of reliability, these components occasionally function improperly.

For example, in MOS integrated circuits, the state of a logic circuit is determined by the charge stored on multiple capacitors. In MOS VLSI designs where gate size is small, transient activities may cause a latch to fail. For example, when a latch in such an integrated circuit is hit by an alpha particle or a gamma ray, the charge on the associated capacitor may change, causing the latch to fail temporarily.

Other failures may be caused by problems in the manufacturing process. Process variations may cause non-linear timing variations, leading to latent hazard conditions. Errors of this type tend to be intermittent and may be difficult to detect. Errors in device assembly such as broken connector wires or foreign matter in the circuit may also result in disfunctional circuitry.

Another potential cause of improper latch operation is metal migration. This may occur when a circuit is operated at too high a temperature causing the metalization layers of the integrated circuit to flow. Broken conduction paths and increased metal resistance caused by this effect may result in intermittent or permanent failures.

Concerns for proper latch operation extend to many configurations. For example, it may be desirable to have a latch type device in which signal changes at the output terminal are effectively isolated from signal changes at the input terminal. Such a scheme is useful where an output of a first latch is connected to the input of a second latch, and where a change of state in the first latch should not propagate through to the second latch.

A type of latch which satisfies these constraints is a master-slave latch. In a master slave configuration, two latches are coupled together, with the output of one tied to the input of the other. This creates a two stage configuration. To reach the output of the second stage, data is placed into the first stage (called the master), responsive to a first clock signal. Upon reaching the first stage output, the data value is transferred to the second stage (called the slave) responsive to a second clock signal. The first and second clock signals may be separate or they may be respectively different transitions of a single clock signal.

U.S. Pat. No. 4,493,077 to Agrawal relates to an integrated circuit which can be reconfigured to step test data through its internal components.

U.S. Pat. No. 4,513,418 to Bardell relates to a shift register based upon level sensitive scan design which can perform signature analysis as a means of self-test.

U.S. Pat. No. 4,554,664 to Schultz relates to a latch cell based upon level sensitive scan design. A static functional latch and a dynamic test latch are included.

SUMMARY OF THE INVENTION

In the present invention, a method is set forth for the verification of correct latch operation in a digital circuit. After a value has been stored in a latch, the stored value is examined to determine whether this value has been stored correctly.

The invention is embodied in an enhanced master-slave latch system. In this system, two comparators are used. A first comparator is used to determine if the internal state of the master latch is identical to the signal which had been applied to this latch's data input terminal. A second comparator is used to determine if the state transfer between the master and slave latches occurs properly.

According to a further aspect of the invention, each comparator may be selectively provided with erroneous input values to verify that it is operating properly.

DETAILED DESCRIPTION

Figure 1:
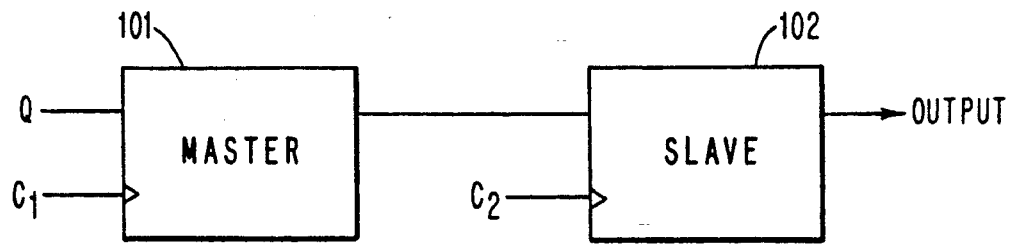
FIG. 1 (prior art) is a block diagram of two latches in a master slave configuration.

There are several steps to verifying that a storage element such as a master-slave latch is functioning properly. First, it is desirable to provide on line checkability, that is, to continuously verify that proper signals are provided to the input terminals of the latch. Second, it is desirable to verify that latch transfers are performed properly. Third, it is important to verify that the test circuitry, which performs the checking operations set forth above, is functioning properly.

A logic family well suited for these types of verifications is Differential Cathode Voltage Switch (DCVS) logic. DCVS logic has two important characteristics which are useful for testing applications. First, this logic family is differential, i.e. for every output signal, there is a complementary output signal. This property allows the logic circuit to be easily tested by verifying that each logic stage produces both a normal output signal and a complementary output signal. Circuit faults in a DCVS device may appear as non-complementary output signals. Due to the design conventions used in DCVS logic, any non-complementary output signals generated by one gate will propagate through any combinational logic circuitry coupled to receive these signals. Thus, errors in the combinational logic will propagate either to the output terminals of the circuit or to the input terminals of a storage device such as a master-slave latch.

Second, the storage devices used in DCVS logic may be set to a specific state at the beginning of a test cycle. This allows test values to be stored within the logic so that the combinational logic in the circuit may be completely tested.

An exemplary method for presetting DCVS storage devices is Level Sensitive Scan Design (LSSD). In an LSSD design memory elements in an integrated circuit are tied together to form a shift register scan path so that all of the memory elements are accessible for use as both a test input point and a test output point. Therefore, with the scan path, test input signals can be introduced or test results observed wherever one of the memory elements occurs in the logic circuit. Being able to enter the logic circuit at any memory element for introducing test signals or observing test results, allows the combinational and sequential logic to be treated as much simpler combinational logic for testing purposes. This considerably simplifies test generation and analysis.

Although portions of the description set forth below are in terms of DCVS logic implemented with LSSD design rules, it is contemplated that other differential or double rail logic families, such as ECL and CML, may be used, with or without LSSD. In the functional mode, these family's associated differential output terminals produce dissimilar logical levels. In the nonfunctional mode, the differential output terminals may produce similar logic levels. These attributes characterize these logic families as a preferable choice where the detection of operational errors is desired.

FIG. 1 is a block diagram of a master slave latch system. In this system, a data signal Q is applied to a data input terminal, and a clock signal $C_1$ is applied to a clock input terminal of a master stage 101. The data signal is loaded into the master stage 101 synchronous with the clock signal $C_1$. After data has propagated to the output terminal of the master stage 101, a clock signal $C_2$ transfers this data into the slave stage 102.

Figure 2:
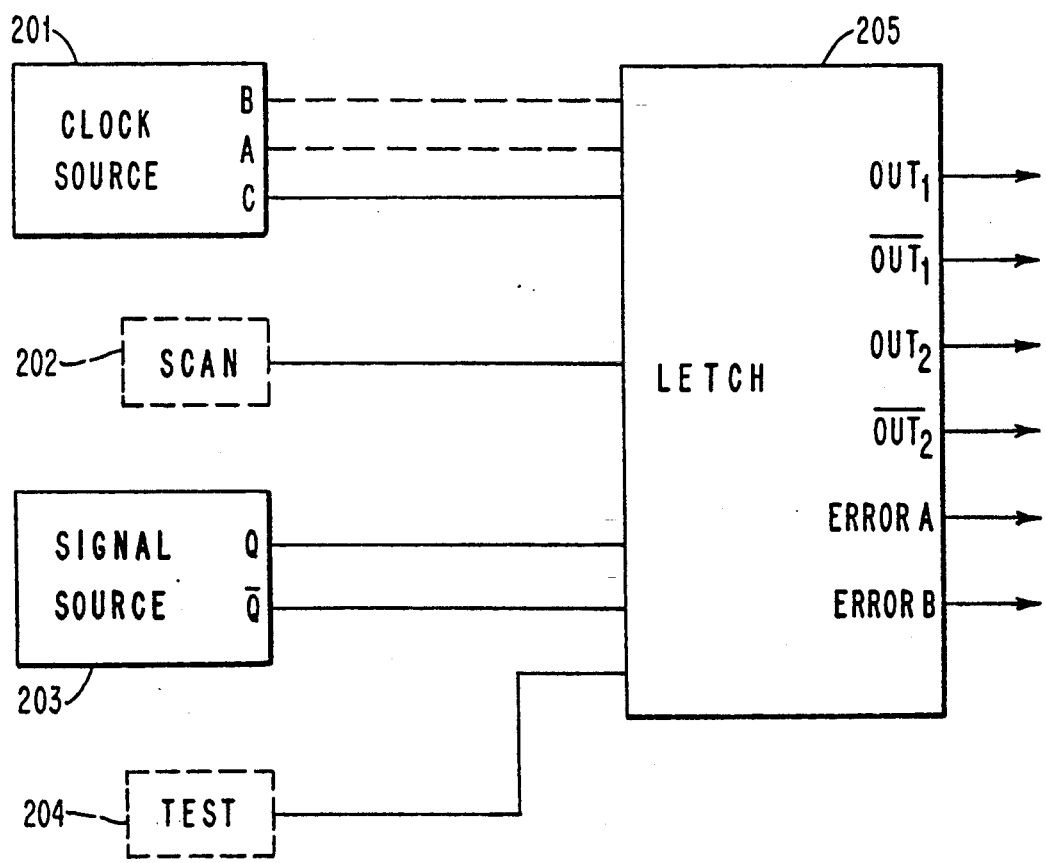
FIG. 2 is a block diagram showing how a circuit which includes an embodiment of the disclosed invention.

The present invention is embodied in a circuit called a LETCH (Latch Easily Testable Checker) 205, shown in FIG. 2. This circuitry may be used, for example as part of a VLSI integrated circuit. The LETCH 205 includes a master-slave latch. The master stage is designated as L1 and the slave stage is designated as L2. Each stage has an output terminal ($OUT_1$ and $OUT_2$ respectively) and an inverted output terminal ($\overline{OUT_1}$ and $\overline{OUT_2}$ respectively.

Two signal sources, TEST 204 and SCAN 202 are optional. These sources are used for checking the fault detection apparatus, and may be deleted if no such checking is desired.

The TEST signal source 204 provides a logic-high output signal when the fault detection circuitry is to be tested. Asserting this signal high brings in data (discussed below) which is used to verify the operation of error detection circuitry. If the error detection circuitry is operational, then asserting this signal high produces an error indication.

SCAN 202 is used in conjunction with the test signal described above. SCAN 202 is the system entry point for data that is used to isolate the error detection circuitry in one LETCH for testing.

SIGNAL SOURCE 203 provides data that will be stored in the LETCH circuit 205. The SIGNAL SOURCE 203 supplies data in a non-inverted state (Q) and an inverted state ($\overline{Q}$). This source represents combinational and sequential logic circuitry in the integrated circuit which generates values for application to the LETCH circuit 205.

A CLOCK SOURCE 201 provides three clock signals: a clock signal C that is used for clocking data into the first latch stage, a clock signal B that is used for clocking data from the first latch stage to the second latch stage and a clock signal A that is used for clocking test data into the first latch stage. Clock signal A and clock signal B are optional. The clock signal A is used for verifying proper operation of the LETCH circuit and may be deleted if no such verification is desired. If clock signal A and clock signal B are deleted, then clock signal C would be used for clocking data into the first latch stage and for transferring data from the first latch stage to the second latch stage.

Figure 3:
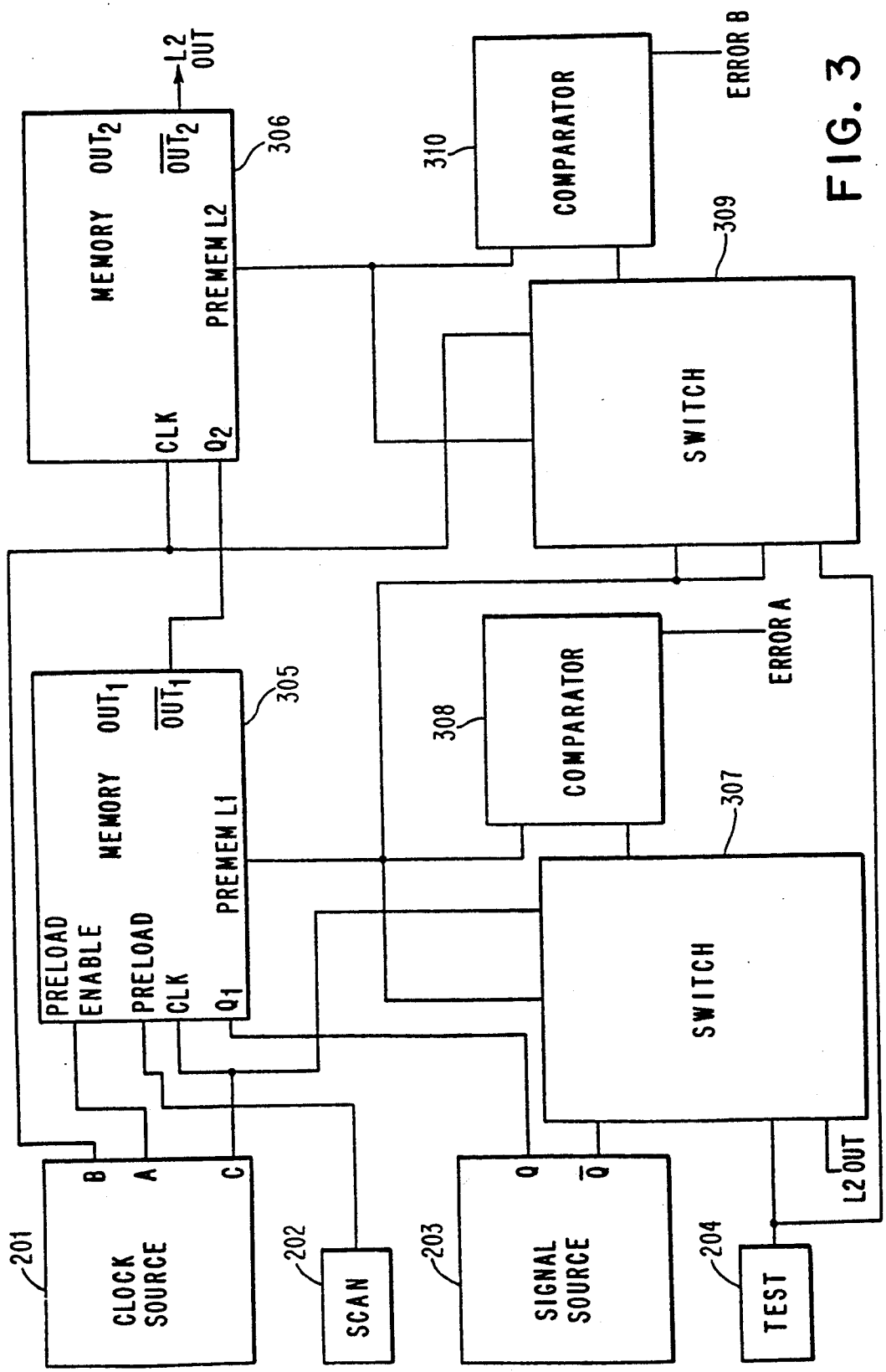
FIG. 3 is a block diagram of a self checking latch circuit which includes an embodiment of the invention.

FIG. 3 is a block diagram of the organizational structure within the LETCH device. The LETCH device includes a first stage simple latch 305 and a second stage simple latch 306. A simple latch consists of a storage element and signal paths which lead to external connections. The first simple latch stage will be referred to as L1 and the second simple latch stage will be referred to as L2.

The exemplary latch L1 has four input terminals and three output terminals. Q1 is the data input terminal for the latch L1. A clock input terminal (CLK) is shown for clocking data into L1. A preload enable input terminal is shown for storing data into L1 independent of the clock signal applied to the input terminal CLK. The preload enable input terminal, is coupled to a preload input terminal in order to load data into latch L1 in synchronism with clock signal A. $OUT_1$ and $\overline{OUT_1}$ are mutually complementary data output terminals of L1. Premem L1 is an output terminal that provides the internal state of the latch L1. In normal operation, the levels of Premem L1 and $OUT_1$ should be identical.

The following example illustrates the operation of the latch L1. A data value, X, is stored in latch L1 by applying this value X to input terminal Q1 and causing clock signal C to change from a high level to a low level. After a propagation delay, the value X will appear at Premem L1 and at $\overline{OUT_1}$ and a value representing $\overline{X}$ will appear at $OUT_1$.

The latch L2 (306) used in this embodiment of the invention has 2 input terminals and 3 output terminals. $Q_2$ is the data input terminal for the second stage. A clock input terminal (CLK) is shown for clocking data into L2. $OUT_2$ is an output terminal of latch L2. An output terminal is the logical complement of $OUT_2$. Premem L2 is an output terminal that provides the internal state of the latch L2.

A connection exists between $\overline{OUT_1}$ and $Q_2$ which allows data to propagate from L1 to L2. When clock signal B changes from a high level to a low level, the data on $Q_2$ is loaded into L2. In this case, L2 will contain the value appearing on $\overline{OUT_1}$. Thus, the original data value can be found at $OUT_2$.

In order to provide accurate self checking, data from the latch may be compared to a reference. This reference is valid when the clock signal into the latch undergoes a high to low transition. Also, this reference is complementary to the latch data under no fault conditions.

In the LETCH, proper operation can be verified by comparing the signals on Premem L1 and Q. In this embodiment of the invention, this comparison is made by a comparator 308. The signals on Premem L1 and Q should always be complementary. The signal on Premem L1 is representative of the data value which has been stored in L1 after propagation through a minimal amount of circuitry. This is discussed in reference to FIG. 5 below. Error A terminal has a high level until an error condition is detected and then it has a low level.

A switch 307 is used for verifying that the comparator 308 is operating properly. When appropriate signals are asserted by TEST and $OUT_2$, switch 307 places the signal on Premem L1 on both input terminals of the comparator 308. In this configuration, the output signal of comparator 308 should indicate an error; i.e. that both inputs are identical.

A second comparator 310 is used for comparing the signal on Premem L2 with the signal on Premem L1. It is noted that the signal on Premem L1 is the signal Q as it was $\overline{\text{stored}}$ in L1 and the signal on Premem L2 is the signal $\overline{OUT}_1$ as it was stored in L2. Thus, if L1 and L2 are operating properly, then the signals on Premem L1 and Premem L2 should be complementary. The output terminal of this comparator 310 is marked as Error B. Error B has a high level if an error condition does not exist (i.e. Premem L1 and Premem L2 are different) and a low level when an error condition is detected (i.e. if premem L1 and Premem L2 are identical).

A switch 309 is used to verify that the comparator 310 is operating properly. When appropriate signals are asserted from the signal source TEST and the signal on Premem L1, the switch 309 places the signal provided by Premem L2 onto both inputs of the comparator 310. If comparator 310 is operating properly, then the signal provided by the output terminal Error B should indicate an error since both input signals to the comparator are the same.

Figure 4:
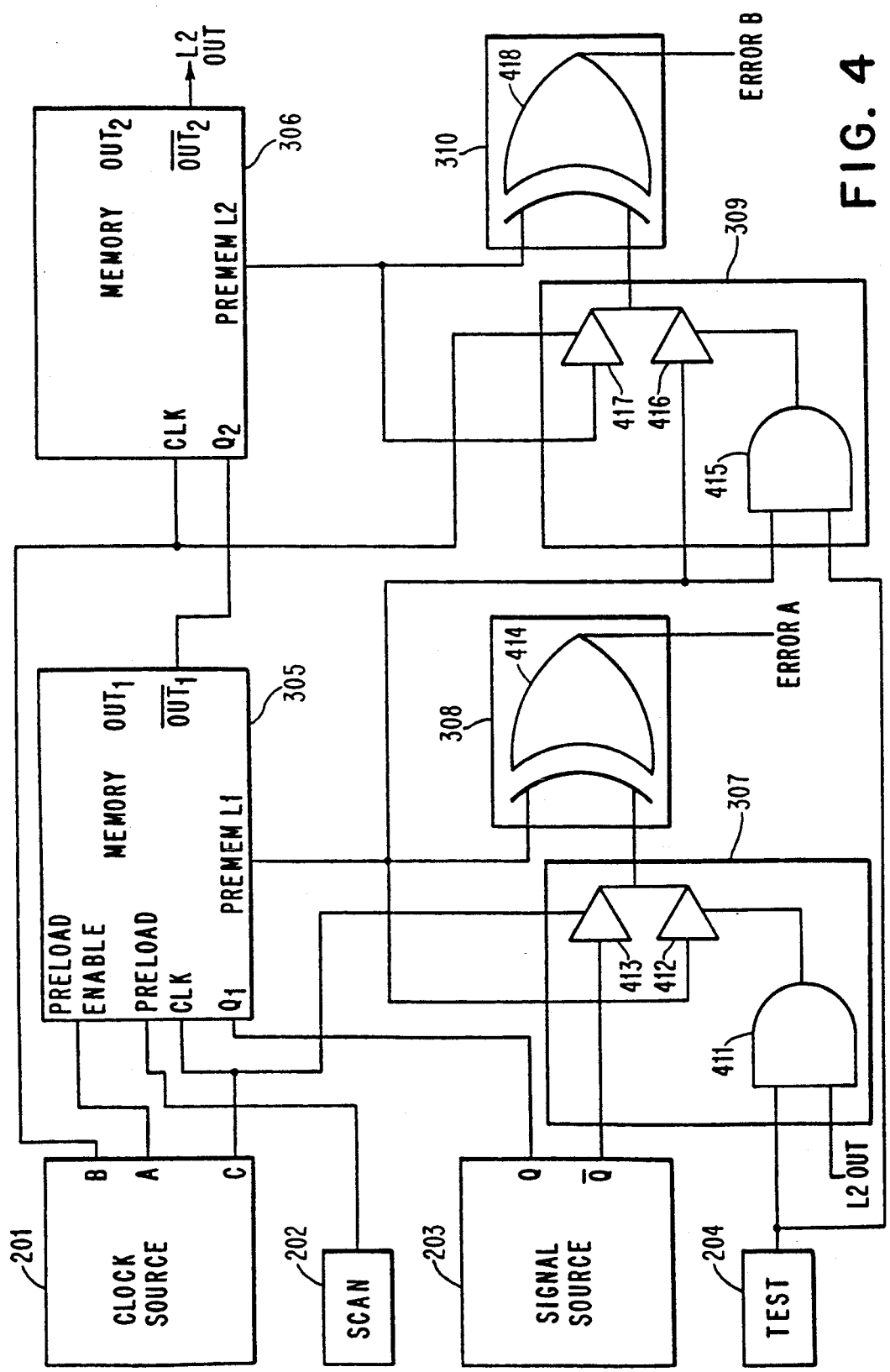
FIG. 4 is a logical representation of the embodiment of the invention shown in FIG. 3.

FIG. 4 is an exemplary logic circuit which implements the LETCH shown in FIG. 3. It is contemplated that other logic circuits may also be used to implement the LETCH circuitry.

The function of comparator 308 and comparator 310 are to indicate whether their respective input signals are identical or different. Thus the internal operation of comparators 308 and 310 is represented by EXCLUSIVE-OR (XOR) gates 414 and 418, respectively.

The switch 307 is represented by an AND gate 411 and two three-state gates 413 and 412. Three-state gates 412 and 413 are turned on (i.e. enabled to pass their input signals to their output terminals) when there is a high level on their select lines.

Three-state gate 412 is turned on in the following manner. Using the SCAN source 202 and the clock signal A, a high level is stored in latch L1. This causes a low signal to propagate to $\overline{OUT}_1$. Responsive to the clock signal B, latch L2 loads a low signal (i.e. $\overline{OUT}_1$) which propagates to the output terminal $OUT_2$. Next, the signal source TEST 204 provides a high signal. The signals provided by the signal source TEST 204 and by the $\overline{OUT}_2$ terminal (i.e. L2 OUT) are applied to respective input terminals of the AND gate 411. These input signals condition this gate to provide a high output signal to the gate 412 conditioning it to pass Premem L1 to the second input terminal of the comparator 308.

When operational data is applied to the LETCH, the comparator 308 performs an XOR function on Premem L1 and Q. Because data is evaluated after it has been clocked into L1, it is desirable to insure that comparator 308 does not evaluate the signals applied to its input terminals until data transfer into L1 is complete. Thus, gate 413 is selected by clock signal C, the same clock that clocks data into L1. When clock signal C goes low, gate 413 is disabled and the value of Q immediately prior to the negative-going transition of the clock signal C is held on the input terminal of the comparator 308. By convention, three-state gate 412 remains disabled during normal data processing.

Three-state gate 412 may be enabled to test comparator 308 to insure that it is functioning properly. In this manner, a self checking EXCLUSIVE-OR gate 419 is implemented. This self checking EXCLUSIVE-OR gate 419 includes XOR gate 414 and three-state gate 412 and three-state gate 413. This self checking EXCLUSIVE-OR gate has four input terminals $X_1$, $X_2$, $C_1$ and $C_2$. Input terminal $X_1$ is coupled to the first input terminal of XOR gate 414 and the input terminal of three-state gate 412. Input terminal $X_2$ is coupled to the input terminal of three-state gate 413. Input terminal $C_1$ is coupled to the control input terminal of three-state gate 412. Input terminal $C_2$ is coupled to the control input terminal of three-state gate 413. The data output terminal of three-state gate 412 and the data output terminal of three-state gate 413 are both coupled to the second input terminal of XOR gate 414. When gate 412 is enabled by applying the appropriate input signal to input terminal $C_1$, the same signal, Premem L1, is applied to both inputs of the self checking EXCLUSIVE-OR gate 419, and thus to both inputs of the XOR gate 414. If the comparator 308 is functioning properly, these input signals will condition it to indicate an error. By convention, comparator testing occurs when three-state gate 413 is disabled (i.e. when clock signal C is low).

The operation of comparator 310 is identical to the operation of comparator 308. However, the input signals for comparator 310 come from the Premem L2 terminal and either the Premem L2 or the Premem L1 terminal (as determined by switch 309). The Premem L1 terminal is selected by switch 309 as a result of a high level on clock signal B. The Premem L2 terminal is selected by switch 309 as a result of high levels provided by signal source TEST 204 and by Premem L1.

Figure 5:
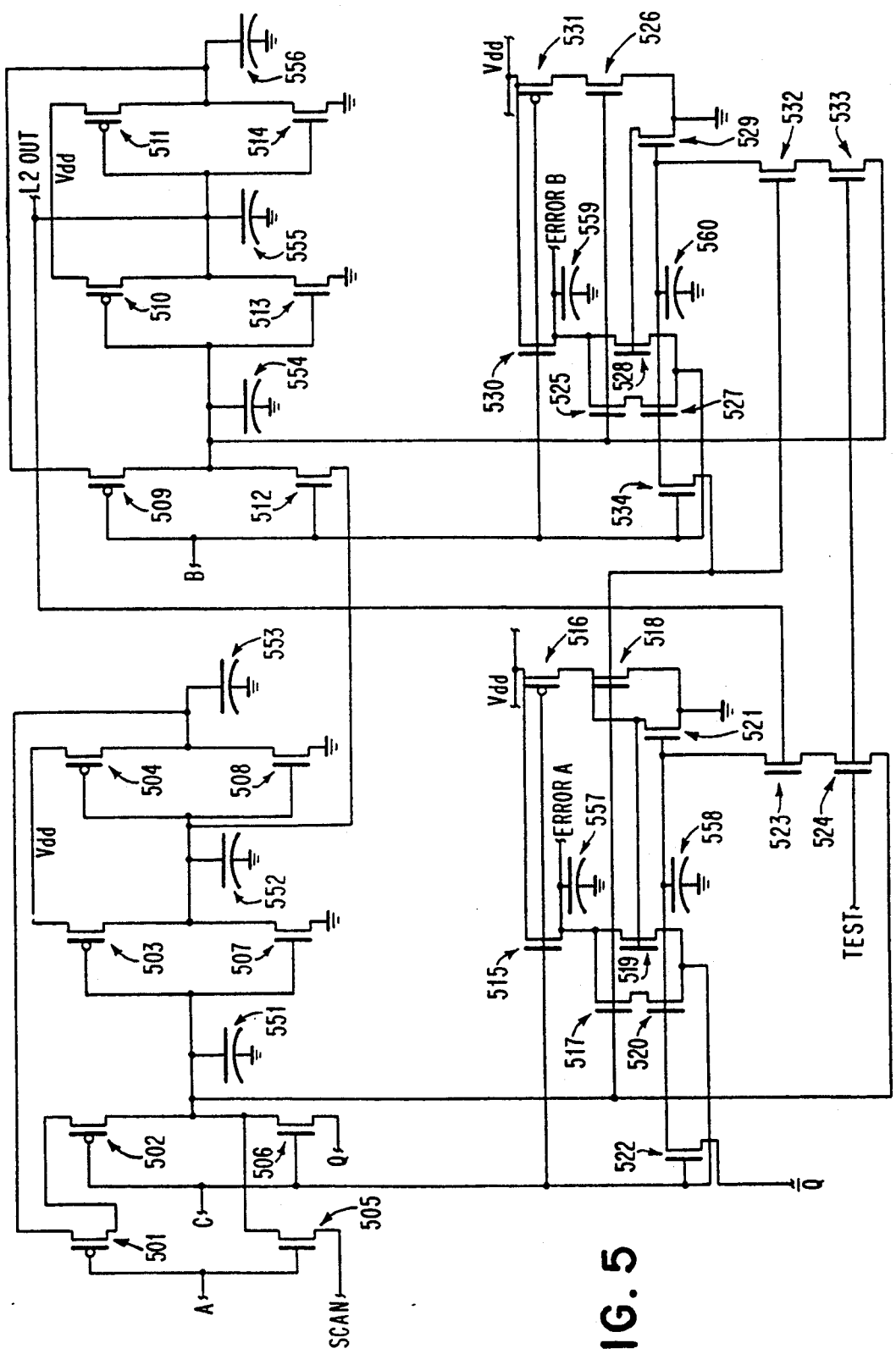
FIG. 5 is a schematic diagram of exemplary circuitry which implements the embodiment of the invention shown in FIGS. 3 and 4.

FIG. 5 is a schematic diagram of an exemplary LETCH circuit implemented in DCVS logic which includes an embodiment of the present invention. It is contemplated that other circuit designs may be used to realize this invention. It is further contemplated that while FIG. 5 is based upon DCVS technology, other types of technology (i.e. NMOS, bipolar, etc.) may be used.

To simplify the explanation of this circuit, reference will be made to the logical circuitry shown in FIG. 4.

In FIG. 5, the simple latch L1 includes transistors 501–508 and capacitors 551–553; latch L2 includes transistors 509–514 and capacitors 554–556. Transistors 501 and 505 are used in conjunction with clock signal A and the SCAN signal to load test data into the circuit. When there is a high level on input A, transistor 505 is turned on. This allows test values from the SCAN source 202 to be stored in L1. When there is a low level on input A, transistor 501 is turned on. This allows data stored on capacitor 553, described below, to propagate to the source electrode of transistor 502. The use of the A input terminal and the SCAN input terminal is further discussed below in reference to FIG. 6C.

Transistors 502 and 506 are used in conjunction with clock signal C and signal source Q for loading actual data into the circuit.

When clock signal C is at a high signal level, a high signal level exists on the gate electrode of transistor 506, turning transistor 506 on. A low signal placed on input terminal Q will cause capacitor 551 to discharge, thus storing a low signal level in latch L1. A lack of charge on capacitor 551 will turn on transistor 503, causing capacitor 552 to charge to a high level. The charge on capacitor 552 will turn on transistor 508 causing capacitor 553 to discharge to a low level. Alternatively, a high signal level placed on input terminal Q will cause capacitor 551 to charge, thus storing a high signal level in latch L1. The charge on capacitor 551 will turn on transistor 507, causing capacitor 552 to discharge to a low level. The lack of charge on capacitor 552 will turn on transistor 504 causing capacitor 553 to charge to a high level.

When clock signal C is at a low signal level, transistor 506 is turned off, thus isolating input terminal Q from the remainder of the circuit.

Transistor 502 is turned on when the clock signal C is at a low signal level. This allows data stored on capacitor 553, described below, to propagate to the source input terminal of transistor 502.

The transistors 503 and 507 function as an inverter. The source electrode of the transistors 503 is connected to a source of operating potential, VDD, which in this embodiment of the invention represents a logic high level. The source electrode of the transistors 507 is connected to a source of reference potential (e.g. ground), which represents a logic low level. When the potential stored on capacitor 551 represents a low signal level, transistor 507 is disabled and transistor 503 is enabled, establishing a high level (VDD) at the interconnected drain electrodes. This potential charges the capacitor 552. Transistors 504 and 508 function in a manner identical to the transistors 503 and 507. Thus the output signal of the transistors 503 and 507 is an inverted version of the level on the Q terminal while the output signal of transistors 504 and 508 is a non-inverted (or inverted twice) version of the level applied to the input terminal Q. The output signal of the transistors 504 and 508 determines the charge on the capacitor 553.

Regardless of the level placed on Q, when a low logic level is applied to the input terminal C, the transistors 501 and 502 are turned on. This provides an electrical path from capacitor 553 to capacitor 551, which establishes a feedback loop that maintains the state of the latch L1.

When a low logic level is applied to the input terminal C, the transistor 506 is turned off. This isolates the latch L1 from changes on terminal Q and maintains respective charges on the capacitors 551, 552 and 553. The signal Premem L1, taken at connection X, represents the logic level stored on capacitor 551.

Switch 307, which is used for verifying proper operation of comparator 308, includes transistors 522, 523 and 524 and a capacitor 558. The functions of the AND gate 311 and three-state gate 312 are performed by transistors 523 and 524. The function of three-state gate 313 is performed by transistor 522. Capacitor 558 is used to store either the value provided by Premem L1 or the value applied to the terminal Q. This value is latched when the level of the clock signal C changes from high to low. The value of capacitor 558 is smaller than the value of capacitor 551. This allows the charge from capacitor 551 to dominate that of the capacitor 558.

The comparator 308 includes transistors 515 through 521. Comparator 308 performs an XOR function as previously discussed. The XOR function may be represented by the equation $A\bar{B} + \bar{A}B$. By using logic identities and DeMorgan's theorem this equation can also be expressed as $(A+B)(\overline{AB})$. Transistors 517 and 520 implement the $(\overline{AB})$ part, and transistors 516, 518, 519 and 521 implement the $(A+B)$ part of this equation.

Transistor 515 is used to precharge the circuit. Responsive to the clock signal C being high, this transistor charges the capacitor 557 to a high value. The $(A+B)$ circuit and the $(\overline{AB})$ circuit are "wire ANDed" together at the junction of the transistor 515 and capacitor 557 to form an XOR function. The output terminal of this function is at this junction and is designated as Error A. This signal is the potential stored across capacitor 557.

The latch L2 functions in the same manner as the latch L1 except that the input signal to the latch L2 is $OUT_1$ rather than Q and the input signal to the checking circuitry is Premem L1 instead of Q. The clock signal B performs the same function for latch L2 as the clock signal C performs for latch L1.

There is one important difference between latch L1 and latch L2. L1 contains transistors 501 and 505. L2 contains nothing analogous. Consequently, only latch L1 may be loaded directly from the scan bus. The state of the latch L2 in a scan load operation depends on the state stored in latch L1.

The switch 309 includes transistors 532, 533 and 534 and a capacitor 560. Comparator 310 consists of transistors 525 through 529 and a capacitor 559. The operation of switch 309 and comparator 310 is identical with the operation of switch 307 and comparator 308, respectively, with differences existing in the source of input signal (Premem L1 and Premem L2 as opposed to Q and Premem L1) and the destination of its output signals.

Figure 6A:
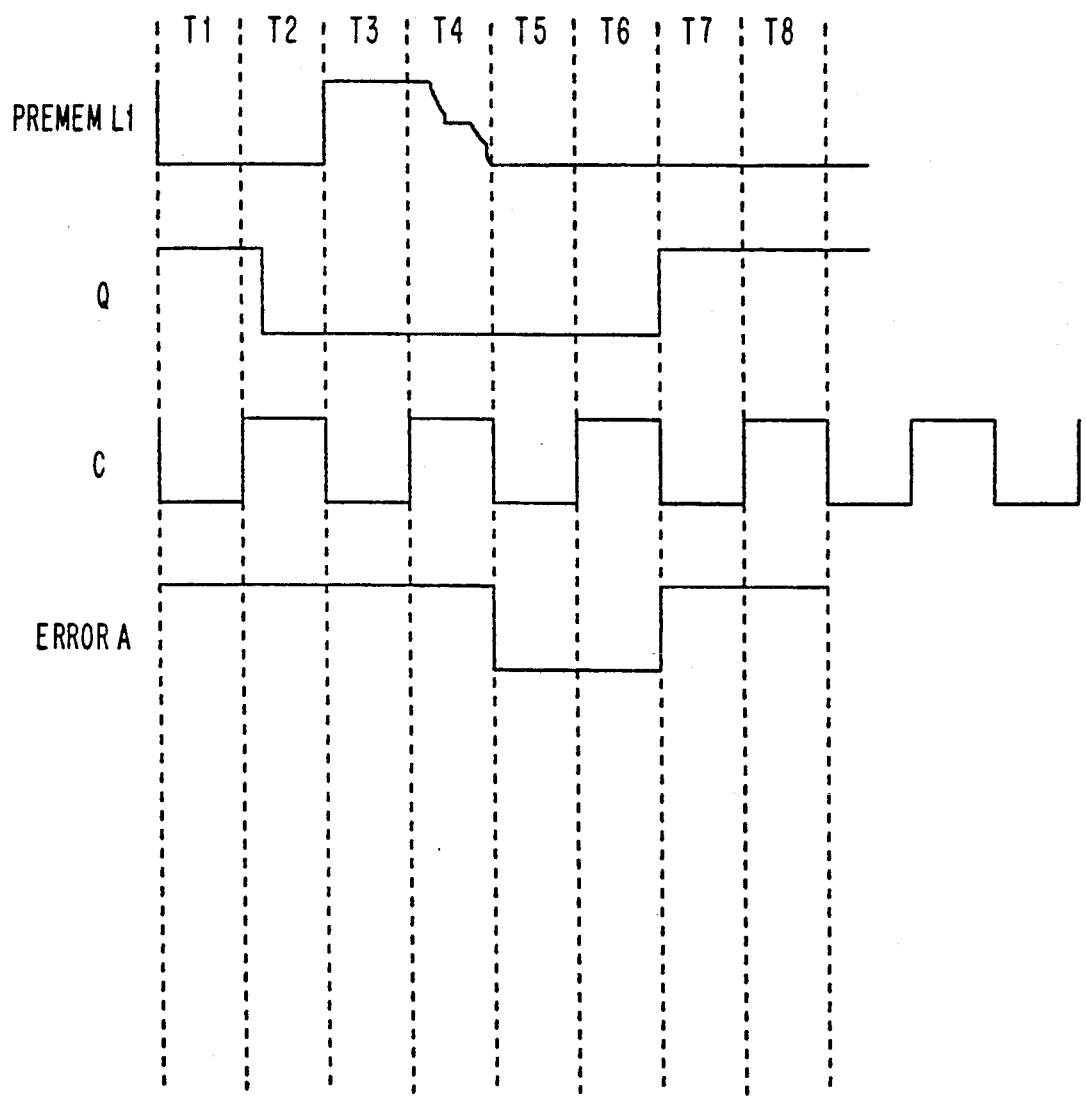
FIGS. 6A through 6C are timing diagrams which are useful for explaining the operation of the circuitry shown in FIG. 5.

FIG. 6A is a timing diagram which illustrates the operation of the circuitry shown in FIG. 5. In time interval T1, the signal on Premem L1 is the inverse of Q. Thus, the signal on Error A is at a high level, indicating no error. In time interval T2, Q experiences a transition from a high value to a low value. In time interval T3, following the negative going transition of clock signal C, the signal on Premem L1 responds to the negative going transition of the previous time interval. Q remains low through time interval T3, T4, T5 and T6. However, during time interval T4, the capacitor 551 is subject to a burst of alpha particles and becomes discharged. Since the signal on Premem L1 and the signal Q are in the same state during time interval T5 and T6, the comparator 314 detects an error and causes the signal on Error A to be low. In time interval T7, the signal Q becomes high. The signal on Premem L1 responds correctly to the level of Q, and as a result, the signal on Error A changes to a high level indicating that the error condition no longer exists.

Figure 6B:
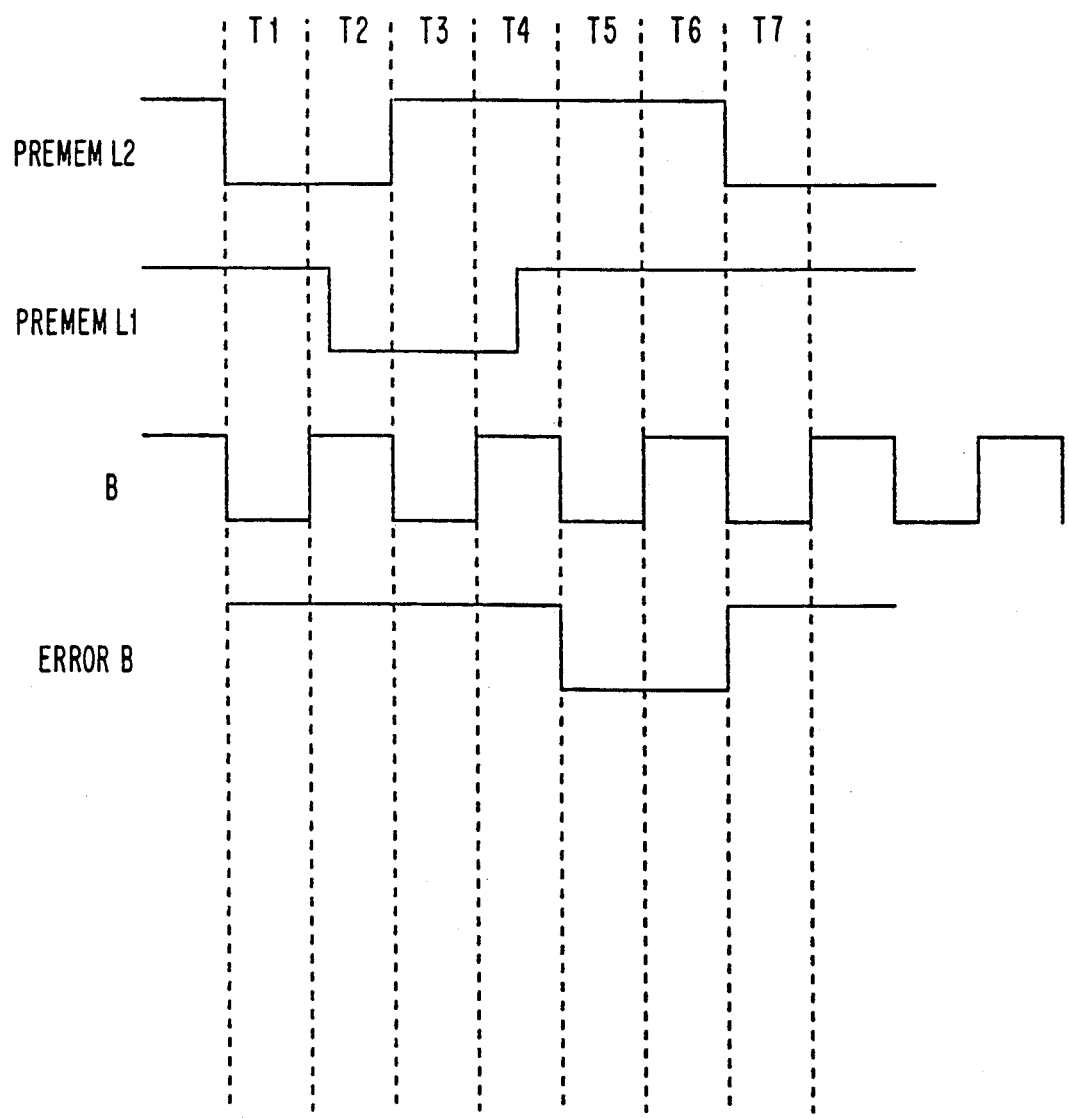

Referring to FIG. 6B, a timing diagram is shown representing how latch transfers are verified. In time interval T1, the signal on Premem L2 is the inverse of the signal on Premem L1. Thus, the signal on Error B is at a high level, indicating no error. In time interval T2, the signal on Premem L1 changes from a high level to a low level. In time interval T3, following the negative-going transition of clock signal B, the signal on Premem L2 responds to the change of the signal Premem L2 from the previous time interval. In time interval T4, the signal on Premem L1 again changes to a high level. In time interval T5, the latch L2, and, thus, the signal on Premem L2 do not respond to this change, indicating an error. As a result, the signal on Error B changes to a low level, signalling the error. In time interval T7, the signal on Premem L2 responds correctly to the level of the signal on Premem L1. As a result, Error B changes to a high level, indicating that the error condition no longer exists.

Figure 6C:
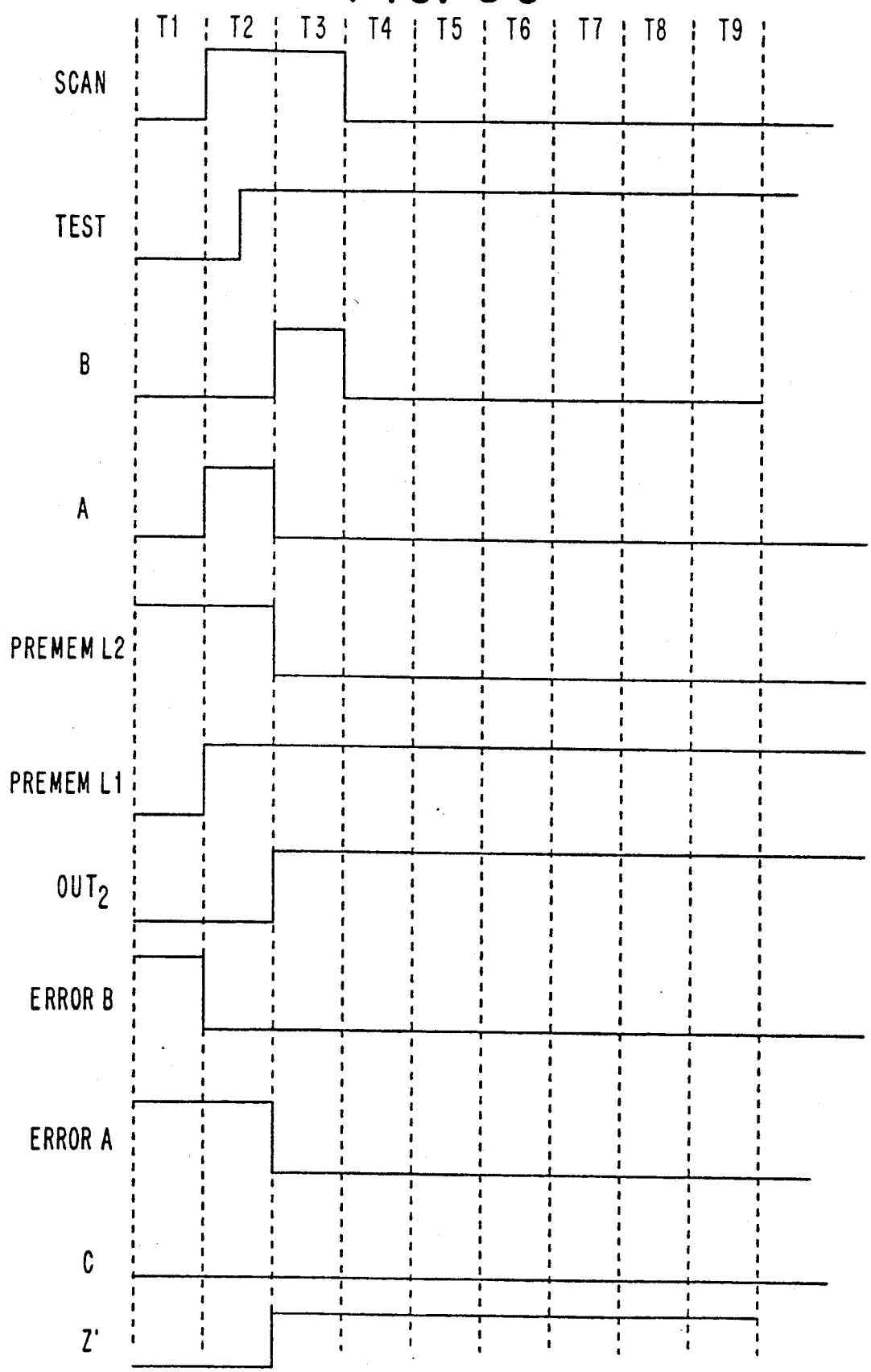

FIG. 6C, is a timing diagram which illustrates how the test circuitry is verified. In time interval T1, the signal on Error A and the signal on Error B are both at high levels, indicating no error. Because output terminal $OUT_1$ is connected with input terminal $Q_2$, the signal on Premem L2 is the opposite logical level of the signal on Premem L1 and the signal on $OUT_2$ is the opposite logical level of signal on Premem L2. The clock signal C is not used when the test circuitry is verified.

In time interval T2, the clock signal A undergoes a transition to a high level, causing the value provided by the SCAN signal source 102 to enter latch L1. The SCAN signal is held at a high level during time intervals T2 and T3. The TEST signal changes to a high level during time interval T2. The combination of the TEST signal and the signal provided by Premem L1 being at a high level causes the output signal of the AND gate 315 to switch to a high level. This turns on three-state gate 316 which places the signal on Premem L2 onto both inputs of XOR function 318. The output of XOR function 318 (Error B), in turn, changes to a low level, indicating an error.

In time interval T3, clock signal B changes to a high level, causing the signal on $OUT_1$ to be applied to latch L2. After a propagation delay, the signal on $OUT_2$ changes to a high level. Because the signal on $OUT_2$ and the TEST signal are both at high levels, the signal Z' provided by the AND gate 311 changes to a high level, causing three-state gate 312 to turn on. This places the signal on Premem L1 onto both inputs of the XOR gate 314. The output of the XOR gate 314, Error A, in turn changes to a low level, indicating an error.

Figure 7:
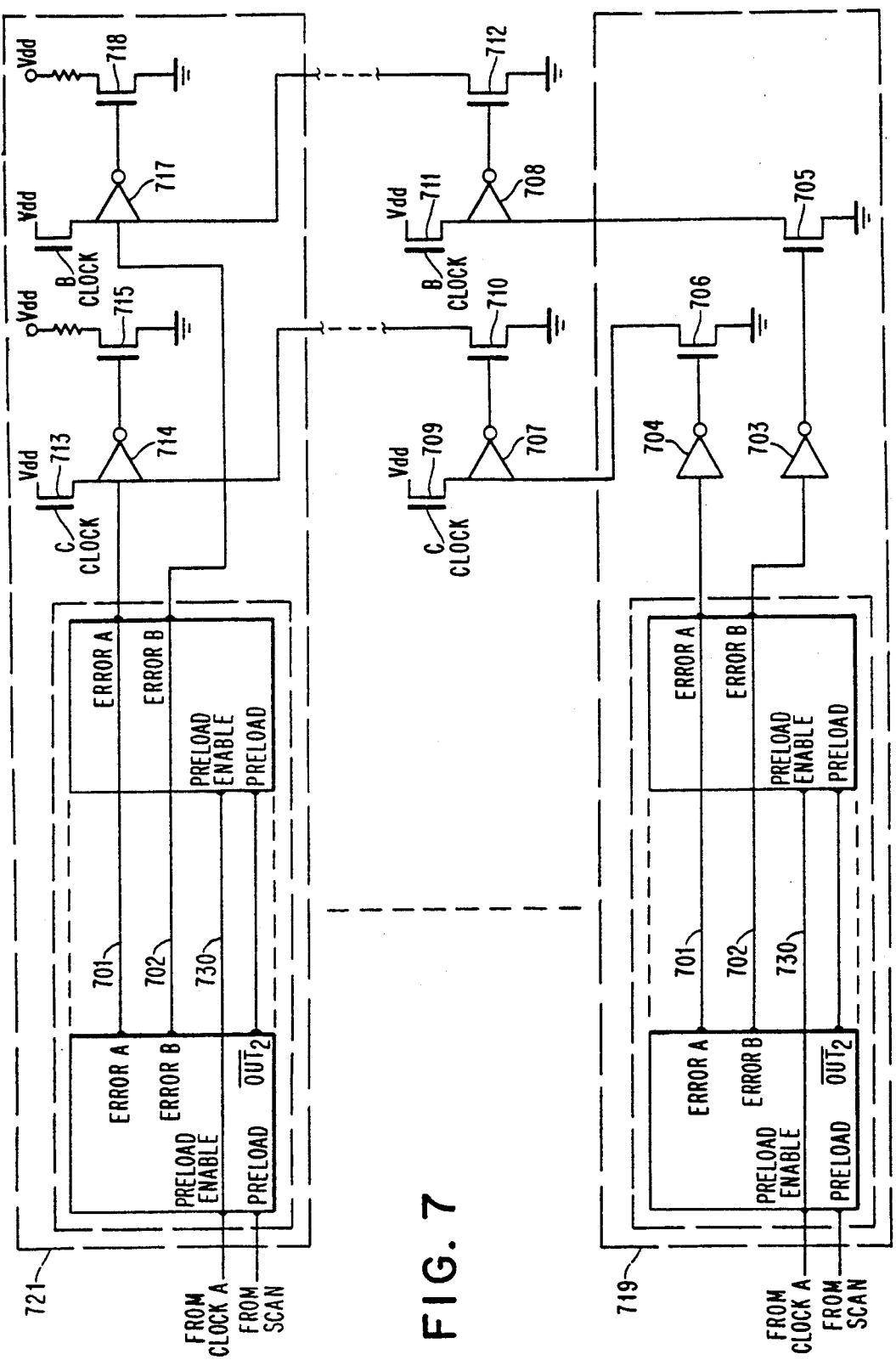
FIG. 7 is a block diagram, partially in schematic diagram form, of an application of a self checking latch circuitry which includes an embodiment of the invention.

FIG. 7 is a block diagram of an application of a self checking latch circuit which includes an embodiment of the present invention. Multiple error lines 701 and 702 are created by interconnecting the Error A output terminals and the Error B output terminals of multiple LETCH circuits. Test data is loaded into these LETCH circuits via a scan chain created by connecting the $OUT_2$ output terminal one latch to the preload input terminal of the next successive latch. When the signal on an error output terminal changes to a low level, indicating an error condition, a low level appears on one or both multiple error lines 701, 702. This low level is applied to the input of an inverter 703 and/or 704 causing a high logic level to appear on the output terminal of the invertor. This high logic level turns on transistor 705 and/or 706 causing the drain electrode of transistor 705 and/or 706 to change to a low logic level. This combination of scan chain, inverters and transistors is referred to as a scan chain inverter device (SCID) group 719. The transistor drain electrodes of this SCID group 719 may be connected to the inverters 707 and 708 within another SCID group. In this way, multiple SCID groups 719, 721 can be chained together as shown in FIG. 7. An error in any latch may be detected at the drain electrodes of transistors 715 and 716 in the final SCID group of the chain 721.

The invention claimed is:

1. A self checking EXCLUSIVE-OR gate, comprising a first input terminal, a second input terminal and an output terminal, said self-checking EXCLUSIVE-OR gate further comprising:

an EXCLUSIVE-OR gate with first and second input terminals and an output terminal coupled to the output terminal of the self checking EXCLUSIVE-OR gate, said EXCLUSIVE-OR gate including:

an OR gate with an output terminal and first and second input terminals coupled to the first and second input terminals of the EXCLUSIVE-OR gate, respectively;

a NAND gate with an output terminal and first and second input terminals, said first and second input terminals coupled to the first and second input terminals of the EXCLUSIVE-OR gate, respectively; and an AND gate having an output terminal and first and second input terminals coupled to the respective output terminals of said OR gate and said NAND gate;

a first THREE-STATE gate with an output terminal coupled to the second input terminal of the EXCLUSIVE-OR gate and an input terminal coupled to the second input terminal of the self checking EXCLUSIVE-OR gate;

a second THREE-STATE gate with an output terminal coupled to the second input terminal of the EXCLUSIVE-OR gate and an input terminal coupled to the first input terminal of the self checking EXCLUSIVE-OR gate; and wherein said EXCLUSIVE-OR gate is checked by enabling said second THREE-STATE gate and by disabling said first THREE-STATE gate.

2. An EXCLUSIVE-OR gate, comprising a first input terminal, a second input terminal and an output terminal, said EXCLUSIVE-OR gate further comprising:

an OR gate with an output terminal and first and second input terminals coupled to the first and second input terminals of the EXCLUSIVE-OR gate, respectively;

a NAND gate with an output terminal and first and second input terminals, said first and second input terminals coupled to the first and second input terminals of the EXCLUSIVE-OR gate, respectively; an AND gate having an output terminal and first and second input terminals coupled to the respective output terminals of said OR gate and said NAND gate, said OR gate comprising:

first, second, third and fourth transistors, the transistors each including first and second electrodes defining a principal conduction path and a control electrode for controlling conductivity thereof;

wherein:

the first electrode of the first transistor, the first electrode of the second transistor and the first electrode of the third transistor are disposed to be coupled to a source of reference potential;

the first electrode of the fourth transistor, the second electrode of the second transistor, the second electrode of the third transistor and the control electrode of the first transistor are coupled together;

the second electrode of the fourth transistor is disposed to be coupled to a source of operating potential;

the second electrode of the first transistor is the output terminal of the OR gate; the first input terminal of the OR gate is coupled to the control electrode of the second transistor;

the second terminal of the OR gate is coupled to the control electrode of the third transistor;

and the control electrodes of the first, second and third transistors control the conductivity of the conduction paths of the respective transistors responsive to a control signal of a first polarity;

and the control electrode of the fourth transistor controlling the conductivity of the conduction path of the fourth transistor responsive to a control signal of a second polarity opposite to said first polarity.

3. The EXCLUSIVE-OR gate of claim 1, wherein the NAND gate comprises:

a first transistor and a second transistor, each including respective first and second electrodes defining respective principal conduction paths, and respective control electrodes for controlling conductivity of said respective principle conduction paths;

wherein:

the second electrode of the first transistor is coupled to the first electrode of the second transistor;

the first electrode of the first transistor is configured to be coupled to a source of reference potential;

the second electrode of the second transistor is the output terminal of the NAND gate;

the control electrode of the second transistor is coupled to the first input terminal of the NAND gate;

and the control electrode of the first transistor is coupled to the second input terminal of the NAND gate.

4. An EXCLUSIVE-OR gate, comprising a first input terminal, a second input terminal and an output terminal, said EXCLUSIVE-OR gate further comprising:

an OR gate with an output terminal and first and second input terminals coupled to the first and second input terminals of the EXCLUSIVE-OR gate, respectively;

a NAND gate with an output terminal and first and second input terminals, said first and second input terminals coupled to the first and second input terminals of the EXCLUSIVE-OR gate, respectively; an AND gate having an output terminal and first and second input terminals coupled to the respective output terminals of said OR gate and said NAND gate, said AND gate comprising:

a transistor and a capacitor, the transistor including first and second electrodes defining a principal conduction path and a control electrode for controlling conductivity thereof;

wherein:

the output terminal of the OR gate and the output terminal of the NAND gate, the first electrode of the transistor, the first electrode of the capacitor, and the output terminal of the AND gate are coupled together;

the second terminal of the transistor is configured to be coupled to a source of operating potential and the second terminal of the capacitor is configured to be coupled to a source of reference potential;

the control electrode of the transistor is configured to be coupled to a signal source which in a first state conditions the transistor to charge the capacitor and in a second state, allows the capacitor to either retain its charge or to discharge depending on logic levels applied to the input terminals of the EXCLUSIVE-OR gate.

* * * * *